United States Patent [19]

Mann et al.

[11] Patent Number: 5,523,527

[45] Date of Patent: Jun. 4, 1996

[54] SLIDING ELECTROMAGNETIC CONTROL CONTACT DEVICE

[75] Inventors: Christopher W. Mann; James L. Peacock, both of Rochester, Minn.

[73] Assignee: International Business Machines Corporation, Armonk, N.Y.

[21] Appl. No.: 363,287

[22] Filed: Dec. 22, 1994

[51] Int. Cl.⁶ .................................................. H05K 9/00
[52] U.S. Cl. ................... 174/35 GC; 174/35 MS
[58] Field of Search ............... 174/35 GC, 35 R, 174/35 MS

[56] References Cited

U.S. PATENT DOCUMENTS

| | | | |
|---|---|---|---|
| 3,962,550 | 6/1976 | Kaiserswerth | 174/35 GC |
| 4,115,655 | 9/1978 | Prentice | 174/35 R |
| 4,322,572 | 3/1982 | Snyder | 174/35 R |
| 4,761,516 | 8/1988 | Reichert | 174/35 GC |
| 4,780,570 | 10/1988 | Chuck | 174/35 GC |
| 4,890,199 | 12/1989 | Beutler | 174/35 R X |
| 5,001,297 | 3/1991 | Peregrim et al. | 174/35 GC |
| 5,029,254 | 7/1991 | Stickney | 174/35 GC |
| 5,035,631 | 7/1991 | Piorunneck et al. | 439/108 |
| 5,099,396 | 3/1992 | Barz et al. | 174/35 R X |
| 5,120,903 | 6/1992 | Tam | 174/35 GC |
| 5,223,670 | 6/1993 | Hogan et al. | 174/35 MS |

OTHER PUBLICATIONS

IBM Technical Disclosure Bulletin, EMC Ground Spring With Single and Dual Connectors On A Planar Board And A Single Connector In A DASD Frame Assembly, vol. 33, No. 1B, Jun. 1990, pp. 93–99.

*Primary Examiner*—Kristine L. Kincaid
*Assistant Examiner*—Michael J. Cornelison
*Attorney, Agent, or Firm*—Caroline G. Kadievitch; John J. Gresens

[57] ABSTRACT

The invention relates to an electromagnetic control (EMC) contact strip. In one embodiment, the strip is mounted to an electrically conductive surface which is adapted to slide in a direction into and out of engagement with another electrically conductive surface. The strip has a base having a length, and a contact formed along the length of the base and defined by a plurality of inverted V-shaped members projecting therefrom. The inverted V-shaped members are compressible in a direction towards the base upon application of a force against the inverted V-shaped members in a direction substantially perpendicular to the length of the base.

18 Claims, 4 Drawing Sheets

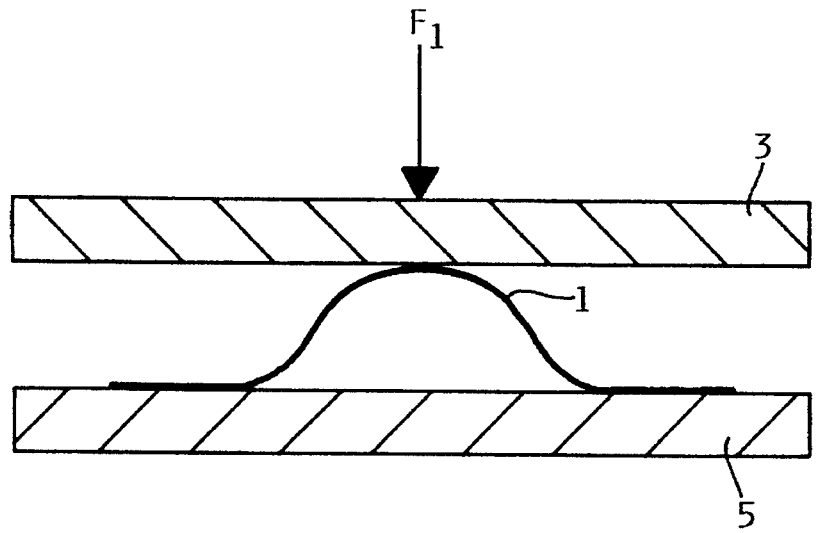
FIG. I (PRIOR ART)
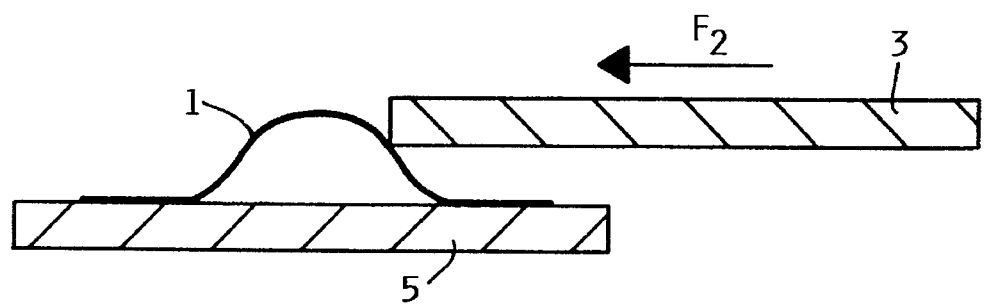
FIG. 2A (PRIOR ART)
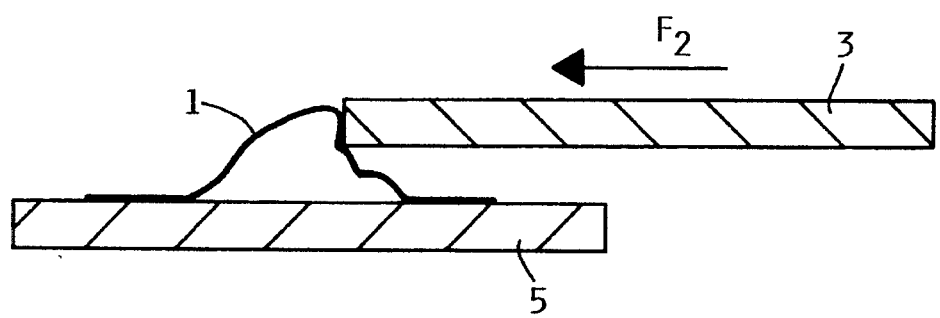
FIG. 2B (PRIOR ART)

SLIDING ELECTROMAGNETIC CONTROL CONTACT DEVICE

FIELD OF THE INVENTION

The present invention relates to an electromagnetic control contact. More particularly, it relates to an electromagnetic control contact for use in sliding applications.

BACKGROUND OF THE INVENTION

Many electronic devices and electrical enclosures contain electrical circuitry that emits electromagnetic signals. These signals often interfere with each other. Such circuitry is also susceptible to interference by electromagnetic signals generated by external circuitry and sources of electromagnetic disturbances. This interference is especially prominent in environments or equipment in which high frequencies (i.e., radio frequencies, for example) are present.

In order to minimize the effects of such interference on the performance of electrical devices, electromagnetic control (EMC) contact devices have emerged. These devices act to inhibit the transmission of such signals so that they do not interfere with adjacent or external circuitry. These devices also act to isolate signal-generating components within the device from the effects of external circuitry and sources of electromagnetic disturbances.

Such electromagnetic signals also cause electrical currents to be induced into conductive components within the device or enclosure. If the components are not connected in an electrically conductive manner, these electrical charges cannot be discharged. As the logic used in electrical devices becomes faster and faster, they become more and more susceptible to electrical charges. Over time, these charges build up and can cause malfunctions within and/or damage to the device. Reliable electromagnetic contact, therefore, is essential to the overall performance of the electrical device.

As a result, EMC contact devices are typically in the form of a compression-type gasket or like device which seals any gaps or clearances between the various components. In many electrical devices, however, it is desirable to have electrical components which are removable so that they may be readily repaired and/or replaced when needed. Conventional sealing-type EMC devices, therefore, are not practical.

As a result, EMC contact devices for enclosures having removable components have been developed. One approach to such EMC contact design is shown in FIG. 1. This approach involves using a conventional leaf spring 1 against two surfaces 3 and 5. When a force F1 is applied to surface 3, spring 1 compresses. The spring is also subjected to sliding forces F2 as is shown in FIG. 2A. Due to the design constraints of such springs, however, they have little axial strength and often cannot withstand the impact of such sliding forces. The shape of spring 1 may, therefore, be deformed or even destroyed upon application of such sliding forces, as is shown in FIG. 2B. When the shape of spring 1 is lost, reliable electromagnetic contact cannot be guaranteed. As a result, the overall performance of the device may be seriously degraded.

One way to further ensure reliable electromagnetic contact is by designing an EMC contact device having high contact density. High contact density, however, often comes at the price of a design which requires a significant amount of space. With the ongoing demand for miniaturized devices, such space constraints are not acceptable.

Accordingly, there is a need for a small-sized sliding EMC contact device that is immune to damage, that provides high contact force and high contact density, and that is easy and inexpensive to assemble and manufacture.

SUMMARY OF THE INVENTION

The present invention relates to an electromagnetic control (EMC) contact device. The EMC contact device comprises a base member having a length; and a contact member formed along the length of the base member and defined by a plurality of inverted V-shaped members projecting from the base member and being compressible in a direction towards the base member upon application of a force from a surface to be contacted by the contact member against the inverted V-shaped side member in a direction substantially perpendicular to the length of the base member so as to maintain electrical contact between the contact member and the surface to be contacted.

The present invention also relates to an electromagnetic control (EMC) shielding device. The EMC shielding device comprises a first electrically conductive surface; a second electrically conductive surface adapted to slide in a direction into and out of engagement with the first electrically conductive surface; and a contact member positioned between the first electrically conductive surface and the second electrically conductive surface, the contact member comprising a plurality of inverted V-shaped members being compressible in a direction substantially perpendicular to the sliding direction of the second electrically conductive surface as the second electrically conductive surface slidably engages the first electrically conductive surface.

The above summary of the present invention is not intended to present each embodiment or every aspect of the present invention. These and other features of the present invention are described in greater detail in the detailed description of the preferred embodiments taken in conjunction with the accompanying drawings.

BRIEF DESCRIPTION OF THE FIGURES

In the drawings, where like numerals refer to like features throughout the several views:

FIG. 1 is a front cross sectional view of a prior art electromagnetic contact design.

FIGS. 2A and 2B are front views of the contact design of FIG. 1 upon application of a sliding force F1.

Figure 3:
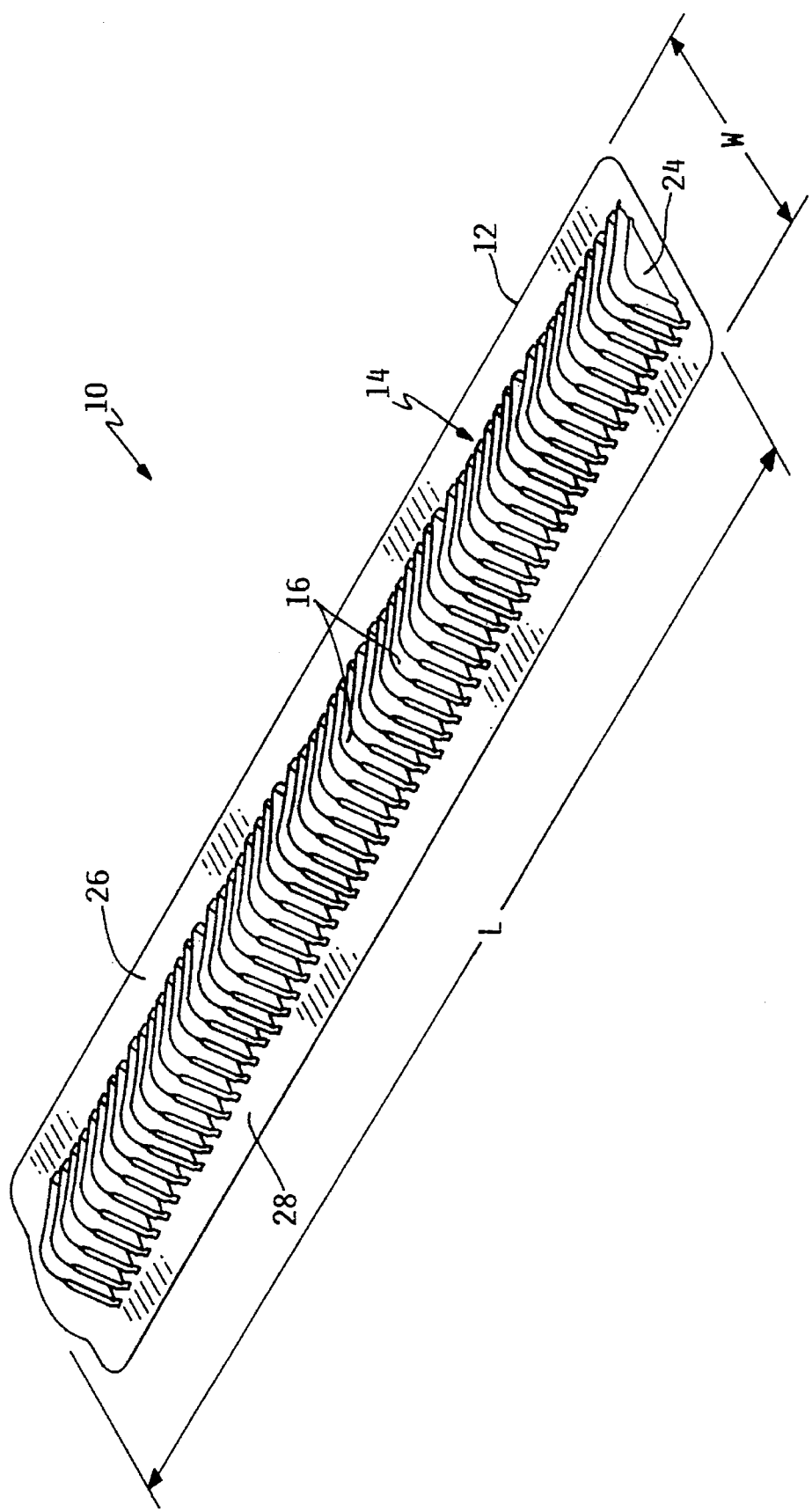
FIG. 3 is a perspective view of an electromagnetic control contact device in accordance with the present invention.

While the invention is susceptive to various modifications and alternate forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE PREFERRED EMBODIMENTS

Referring now to FIG. 3, an electromagnetic control (EMC) contact device 10 in the form of a strip is shown. A preferred EMC contact device is made of a material that has excellent spring and electrical contact characteristics, such as nickel silver. It can be appreciated, however, that other materials can be used, provided they have the requisite spring and electrical contact characteristics, such as beryllium copper, for example, EMC contact device 10 has a base member 12 and a contact member 14 formed along the length of base member 12. Base member 12 is shown in the form of a rectangle having a length L, and a width, W. In a preferred form, length L is determined by the application and width W is determined by the gap between opening 30 and the over surface of frame 34. It can be appreciated by one skilled in the art, however, that the shape of base member 12 is not critical.

Base member 12 defines a central region 24 in which contact member 14 is located and two side regions, 26 and 28, on opposite sides of central region 24. Side regions 26 and 28 provide grounding contacts for EMC contact device 10. Base member 12 also preferably includes a mounting mechanism (not shown) through which base member 12 may be mounted to a surface, as will be further discussed herein. Any conventional mounting mechanism may be used such as an adhesive, rivets, and screws, for example.

Contact member 14 is preferably in the form of a spring which runs the length L of base member 12. Contact member 14 is defined by a plurality of V-shaped members 16 which project from base member 12. By using a plurality of such members 16, a redundant configuration is obtained such that any damage to one of the V-shaped members 16 does not adversely impact on the overall performance of the device. As a result, high contact density between EMC contact device 10 and the surface to be contacted can be ensured. This is especially important when the surface to be contacted is uneven.

The design of contact member 14 further reduces the risk of damage to V-shaped members 16 due to sliding forces. Specifically, contact member 14 is constructed so that it is substantially rigid in the direction perpendicular to the length L of base member 12 so that it maintains its shape when contacted by a sliding force. With such a construction, EMC contact device 10 is immunized from damage.

Figure 5A:
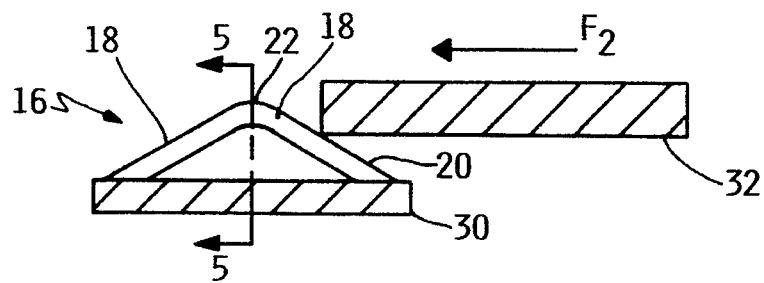
FIG. 5A is a front cross sectional view of the contact device of FIG. 3, prior to the application of a sliding force F2.
Figure 5B:
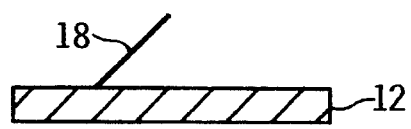
FIG. 5B is a side cross sectional view taken along the line 5—5 of the contact device of FIG. 5A.
Figure 6A:
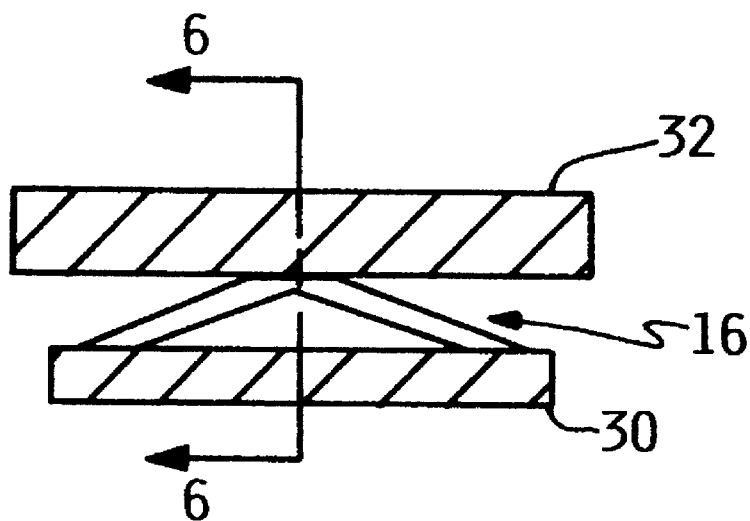
FIG. 6A is a front cross sectional view of the contact device of FIG. 3, upon application of a sliding force F2.
Figure 6B:
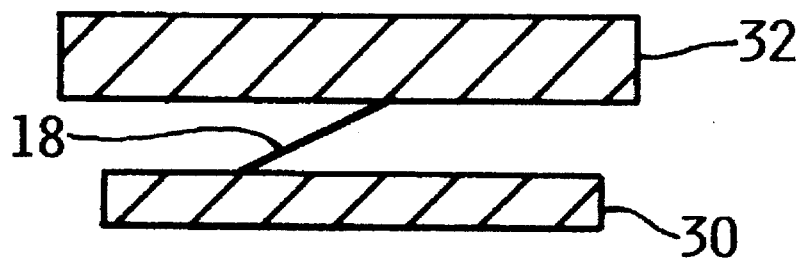
FIG. 6B is a side cross sectional view taken along the line 6—6 of the contact device of FIG. 6A.

With further reference to FIG. 5A, each inverted V-shaped member 16 of contact member 14 is made up of a first arm 18 and a second arm 20 which extend from base member 12 and join to form an apex 22. In a preferred form, apex 22 is slightly curved so that damage or scoring of item 32 is avoided. First arm 18 and second arm 20 as shown in FIG. 5A are substantially straight. It can be appreciated, however, that first arm 18 and second arm 20 may be slightly curved without impacting on the performance of EMC contact device 10. Inverted V-shaped members 16 define a width which remains substantially constant as contact member 14 changes between an uncompressed state and a compressed state.

The other ends of first arm 18 and second arm 20 form living hinges with side regions 26 and 28, respectively, of base member 12. First and second arms 18 and 20 of contact member 14 lie in a plane which is at an acute angle to the plane in which base member 12 lies. Preferably, the angle ranges between 15 and 45 degrees when contact member 14 is in an uncompressed state.

Figure 4:
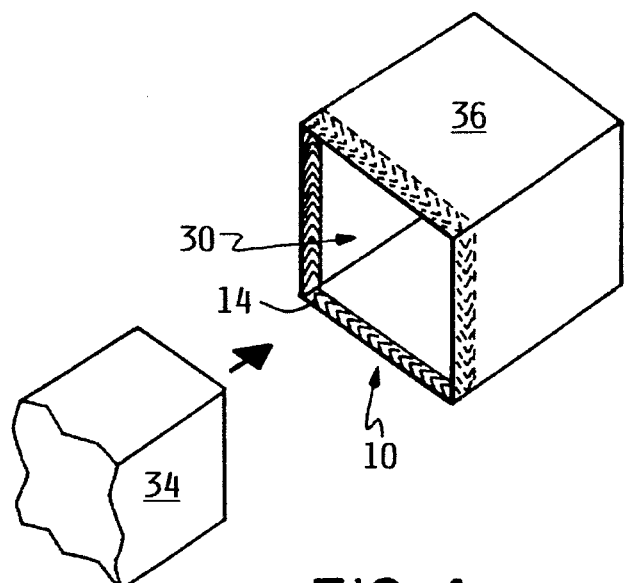
FIG. 4 is a perspective view of the contact device of FIG. 3, in use.

A preferred manner of using contact device 10 is illustrated in FIG. 4 with respect to a frame 34 which slides into a housing 36. As shown, EMC contact device 10 is mounted to the inner electrically conductive surfaces of the four edges around the opening 30 of housing 36. The outer electrically conductive surfaces of frame 34 are adapted to slidably engage the inner electrically conductive surfaces of housing 36. While EMC contact device 10 has been shown mounted to housing 36, it can be appreciated that it may also be mounted to frame 34.

As frame 34 slidably engages housing 36, the other electrically conductive surfaces of frame 34 make contact with contact device 10 and causes it to be compressed. The highly rigid V-shaped members 16 resist the loads seen during the sliding motion. Deflection of contact member 14 is through rotation of contact member 14 about base member 12. The sliding forces are converted to rotational forces due to the angled surface of contact member 14 with respect to base member 12. Because the design of contact member 14 prevents it from losing its shape, reliable electrical continuity between the electrically conductive surfaces of housing 36 and frame 34 is achieved. As a result, a high performance EMC contact device 10 is obtained.

The foregoing description, which has been disclosed by way of the above examples and discussion, addresses preferred embodiments of the present invention.

The invention is not to be construed as to be limited by the specific embodiments described above or shown in the drawings, but is limited only by the broad general meaning of the following claims.

What is claimed is:

1. An electromagnetic control contact device, comprising:
   a base member having a length and a width; and
   a contact member formed along the length of the base member, said contact member comprising a plurality of inverted V-shaped members projecting from the base member, each of said inverted V-shaped members joined to the base in at least two points across the base width, said inverted V-shaped members being compressible in a direction towards the base member upon application of a force from a surface to be contacted in a direction substantially perpendicular to the length of the base member so as to maintain electrical contact between the contact member and the surface to be contacted.

2. The electromagnetic control contact device of claim 1, wherein the contact member comprises a spring and the base member defines a central region in which the spring is located, and two side regions on opposite sides of the central region, the side regions of the base member comprising a ground contact for the contact member.

3. The electromagnetic control contact device of claim 1, wherein the contact member comprises a spring.

4. The electromagnetic control contact device of claim 1, wherein the inverted V-shaped members define a width which remains substantially constant as the contact member changes between an uncompressed state and a compressed state.

5. The electromagnetic control contact device of claim 1, wherein the contact member is substantially rigid in the direction substantially perpendicular to the length of the base member.

6. The electromagnetic control contact device of claim 1, wherein each of the inverted V-shaped members comprises a substantially straight first arm and a substantially straight second arm which extend from the base member.

7. The electromagnetic control contact device of claim 1, wherein the base member lies in a first plane and wherein the contact member lies in a second plane at an acute angle to the first plane.

8. The electromagnetic control contact device claim 7, wherein the second plane of the contact member rotates toward the first plane of the base member upon compression of the contact member.

9. The electromagnetic control contact device of claim 1, wherein the base member comprises mounting means for mounting the contact strip to a surface.

10. An electromagnetic control shielding device, comprising:

a first electrically conductive surface;

a second electrically conductive surface adapted to slide in a direction into and out of engagement with the first electrically conductive surface; and a contact member comprising a base member, said base member having a length and a width, said contact member positioned between the first electrically conductive surface and the second electrically conductive surface, the contact member comprising a plurality of inverted V-shaped members each of said inverted V-shaped members joined to the base in at least two points across the base width said inverted V-shaped members being compressible in a direction substantially perpendicular to the sliding direction of the second electrically conductive surface as the second electrically conductive surface slidably engages the first electrically conductive surface.

11. The shielding device of claim 10, wherein the contact member further comprises a base member having a length, the base member defining a central region in which the plurality of inverted V-shaped members are located, and two side regions on opposite sides of the central region, the side regions comprising a ground contact for the contact member.

12. The shielding device of claim 11, wherein the contact member comprises a spring.

13. The shielding device of claim 11, wherein the base member comprises mounting means for mounting the contact member to at least one of the first electrically conductive surface and the second electrically conductive surface.

14. The shielding device of claim 11, wherein the inverted V-shaped members define a width which remains substantially constant as the second electrically conductive surface slides into and out of engagement with the first electrically conductive surface.

15. The shielding device of claim 11, wherein the contact member is substantially rigid in the direction substantially perpendicular to the length of the base member.

16. The shielding device of claim 10, wherein the first electrically conductive surface and the second electrically conductive surface lie in a first plane and wherein the contact member lies in a second plane at an acute angle to the first plane.

17. The shielding device of claim 16, wherein the second plane of the contact member rotates toward the first plane as the second electrically conductive surface slidably engages the first electrically conductive surface.

18. The shielding device of claim 10, wherein each of the inverted V-shaped members comprises a substantially straight first arm and a substantially straight second arm which extend from the base member.

* * * * *